United States Patent [19]

Keating

[11] Patent Number: 4,743,856

[45] Date of Patent: May 10, 1988

[54] DIGITAL OPTICAL RECEIVER CIRCUIT

[75] Inventor: John M. Keating, Northridge, Calif.

[73] Assignee: Simulaser Corporation, City of Industry, Calif.

[21] Appl. No.: 854,058

[22] Filed: Apr. 18, 1986

Related U.S. Application Data

[63] Continuation of Ser. No. 535,899, Sep. 26, 1983, abandoned.

[51] Int. Cl.[4] .......................... H03K 5/22; H01J 40/14
[52] U.S. Cl. ...................................... 328/111; 328/58; 250/214 DC; 250/214 B; 307/234; 307/311; 307/265
[58] Field of Search ........ 250/214 B, 214 DC, 214 A; 307/234, 311, 265, 268, 360, 365; 455/619; 328/111, 127, 165, 58, 54

[56] References Cited

U.S. PATENT DOCUMENTS

| | | | |
|---|---|---|---|
| 3,721,891 | 3/1973 | Moses | 307/265 |
| 3,866,146 | 2/1975 | Van Mourik | 307/265 |
| 3,921,081 | 11/1975 | Lane | 307/265 |
| 4,091,379 | 5/1978 | Wu et al. | 307/268 |
| 4,115,006 | 9/1978 | Reymond et al. | 250/214 B |
| 4,135,160 | 1/1979 | Gagliani | 328/111 |
| 4,162,052 | 7/1979 | Lamelot | 250/214 B |
| 4,163,192 | 7/1979 | Sutphin, Jr. | 307/268 |
| 4,200,812 | 4/1980 | Fichter | 307/265 |
| 4,245,167 | 1/1981 | Stein | 307/265 |
| 4,306,145 | 12/1981 | Hill | 307/311 |
| 4,434,363 | 2/1984 | Yorifuji et al. | 250/214 B |

Primary Examiner—Stanley D. Miller
Assistant Examiner—Timothy P. Callahan
Attorney, Agent, or Firm—Flehr, Hohbach, Test, Albritton & Herbert

[57] ABSTRACT

A digital optical receiver circuit adapted to operate over a wide input dynamic range without distorting its output signal. The circuit includes a first circuit for receiving input signals in a selected pulse width range and converting them into output signals of extended pulse width. A second circuit will then convert the output signals into digital signals of the same pulse width.

10 Claims, 2 Drawing Sheets

DIGITAL OPTICAL RECEIVER CIRCUIT

This is a continuation of application Ser. No. 535,899 filed Sept. 26, 1983, and now abandoned.

BACKGROUND OF THE INVENTION

This invention relates to digital optical receiver circuits, and more particularly to such circuits which operate over a wide input dynamic range (e.g. from 3 microwatts/cm$^2$ to 1.5 watts/cm$^2$, or 56.9 db) without distorting its output signal. In general, digital optical receiver circuits are designed to operate over a very narrow input dynamic range e.g., 10 db, or with fixed input power level. Such design is commonly used because most optical communications links communicate between fixed distances. Consequently such circuits have a relatively high input sensitivity to permit operation on a low power budget. However, such circuits also tend to overload at input power only slightly greater than the minimal required input because of the large amplification used. An example of such circuit is shown in FIG. 1. Such circuits when overloaded result in seriously distorted output signals due to amplifier saturation. In some cases, such circuits will latch into one logic state for an unpredictable time period, or give an unpredictable, unintelligible output when the specified input levels are exceeded. However, in the case of weapons training systems utilizing laser transmitters mounted on the weapon to simulate the firing of the weapon, such weapon laser may fire at a target over a wide range of distances from point blank range to a range beyond the useful limits of the weapon sight. Under such circumstances, the receiver circuit is inherently subject to a wide dynamic range of incident power levels while a large amount of information is being transmitted by the laser beam. Thus any distortion of the received signal, particularly if it becomes latched-up, will likely cause incorrect decoding or a failure to decode the signal.

Consequently an object of the present invention is a digital optical receiver circuit adapted to operate over a wide input dynamic range without distorting its output signal. Another object of the present invention is such receiver circuit which can operate in full sunlight with a low false output rate due to sun-induced noise. Still another object of the present invention is such receiver circuit which operates from a single power supply with low power consumption. Still another object of the present invention is such receiver circuit which provides a high capacitance output drive capability but permits multiple units to be connected in parallel without affecting its operating characteristics.

SUMMARY OF THE INVENTION

In general the present invention involves a digital optical receiver circuit having a first circuit means for receiving and converting high level input signals into output digital signals of extended pulse width similar to those produced by lower level input signals. A second circuit means then receives said similar extended pulse width signals and generates output digital signals of the same pulse width based only on the initial portion of the digital signal received. Preferably the invention includes (a) circuit means for receiving a photodiode generated input signals and passing substantially only output signals to said first circuit means in a selected pulse width range, (b) having the first circuit means include means initiating pulse at a higher voltage than the voltage for terminating the output digital signal pulse and (c) circuit means for buffering the output digital signals of the second circuit means from the load.

In order to facilitate understanding of the present invention, reference will now be made to the drawings showing a preferred specific embodiment of the present invention and a specific example thereof. Such example, like the preceding summary, should not be construed as limiting the present invention which is properly set forth in the appended claims.

DESCRIPTION OF THE PREFERRED EMBODIMENT OF THE INVENTION

Figure 2:
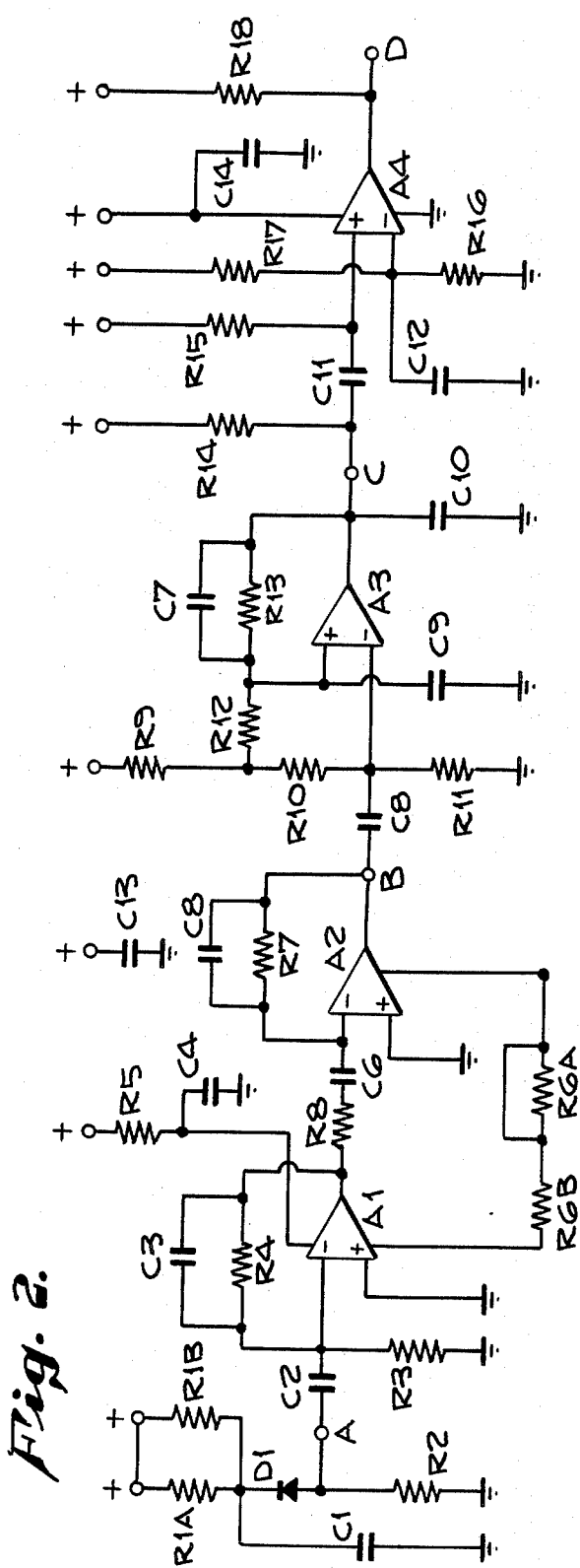
FIG. 2 is a schematic drawing of the preferred embodiment of the digital optical receiver circuit of the present invention.
Figure 3:
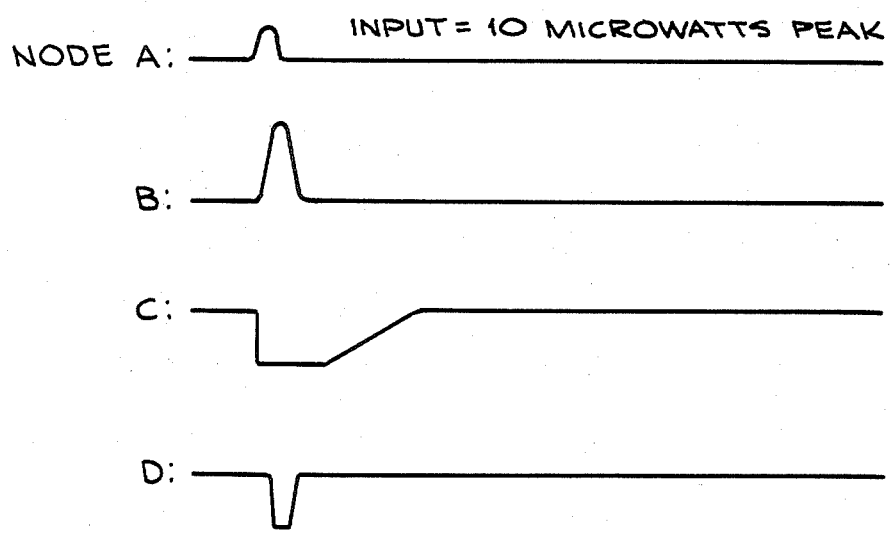
FIG. 3 is a graph on an illustrative digital signal at various points in the circuit of FIG. 2 when processing a low level input signal.

As shown in FIG. 2, the preferred embodiment of the present invention receives input signal at node A (illustrated in FIG. 3) generated by a photodiode circuit which converts an incoming laser light signal into a complex electrical current pattern whose peaks vary in proportion to the strength of the light signal. Such photodiode circuit, per se, is not part of the present invention but is shown to illustrate an application of the present invention, i.e., a weapon training system digital optical receiver circuit.

Between node A and node B in FIG. 2, the input signal first passes through a high pass filter circuit of R3-C2 wwhich passes only signals above a desired frequency. Next the signal passes through a first amplifier A1, a tuned high-pass network R8-C6 and then a second amplifier A2. The loop from A2 to A1 containing R6A (which may be shorted out) and R6B sets the power consumption of the A1 and A2 combination at a desired minimum level. The resistances R4 and R7 set gain for A1 and A2, respectively to a desired level while C3 and C5 in combination with R4 and R7, respectively, limit the bandwidth of A1 and A2 to form a cutoff frequency above which signals are highly attenuated. The combination of such cutoff circuits and the high pass circuit causes the circuit portion between node A and node B to operate as a bandpass circuit to pass substantially only output in a selected pulse width or input frequency range (e.g. the weapon laser frequency illustrated in FIG. 3). Such circuit portion attenuates all other frequencies including noise voltage signals resulting from current induced by sunlight incident on the photodiode.

Between node B and node C in FIG. 2, the input signal first passes through C8 to remove the direct current offset voltage present at node B. Next the input signal enters the negative input of amplifier A3 and when it is greater than the voltage present at the positive input of amplifier A3, determined by the input biasing circuit including R9, R10 and R11, and the hysteresis action of R13, a negative-going output signal of digital logic amplitude (illustrated in FIG. 3) is produced at node C thereby switching node C from its high logic state to its low logic state and causing the discharge of C10 through amplifier A3. When the input signal terminates, the amplifier A3 then switches "off" and node C slowly returns to its high voltage state as C10 is charged through R14 from the power supply. The resulting digital pulse signal then enters amplifier A4 through C11; however the C11-R15 circuit fully passes only the leading edge of such pulse signal and sharply differentiates (decreases) the remaining portion of such pulse signal. The abbreviated pulse entering A4 causes A4 to produce a normal square digital output pulse at node D (illustrated in FIG. 3).

Figure 4:
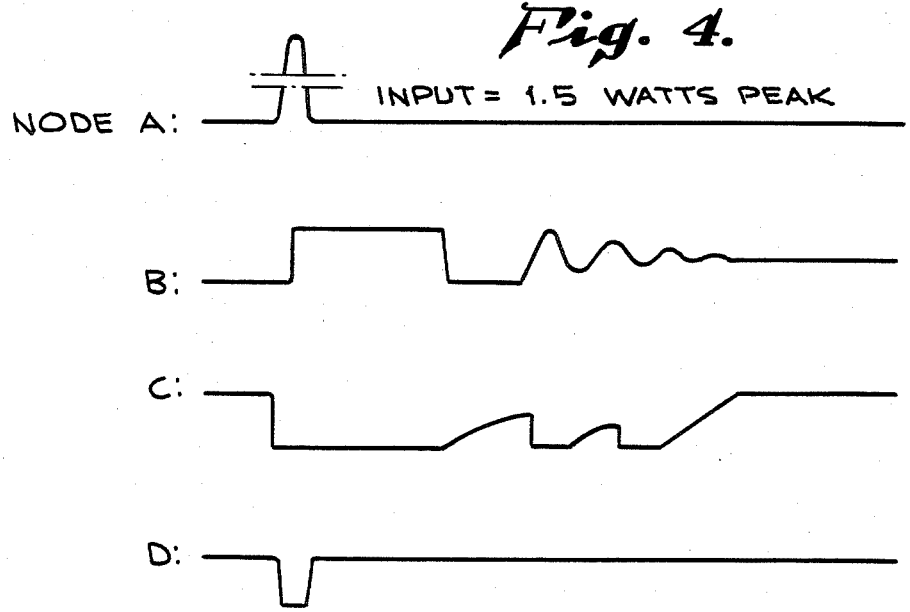
FIG. 4 is a graph of an illustrative digital signal at various points in the circuit of FIG. 2 when processing a high level input signal.

The foregoing description of the circuit of the present invention describes its operation when a low power input signal is applied. In the case of a high power input signal at node A (illustrated in FIG. 4) the peak signal level is so high that it exceeds the output capability of the combination of A1 and A2 which is limited by their power supply voltage and the internal characteristics of A1 and A2. Consequently, the output signal at node B has a voltage "plateau" near such limit, i.e., the peak portion of the output signal above such limit is "clipped off" and the saturation of the amplifiers A1 and A2 usually "stretches" the output signal pulse width and may cause more than one pulse to appear as illustrated in FIG. 4. Such distorted output signal is transformed by A3 into similar digital logic pulses at node C; however the R14-C10 circuit described above causes the multiple pulses to appear as a single elongated pulse. In turn, the R15-C11 circuit described above passes only the leading edge of such single elongated pulse so that the output signal at node D after passing through A4 is a substantially normal square digital pulse. Such pulse is virtually indistinguishable from the output pulse caused by the low power input signal described above.

Amplifier A4 serves as a buffer which permits the output of the receiver to be connected to a high capacitance load without affecting the operation of the preceding portions of the circuit.

A specific example of the circuit shown as in FIG. 2 is set forth in Table 1 below:

TABLE 1

| C1 .1 mF | C9 100 pF | R3 47K | R10 2.2.K |
|---|---|---|---|
| C2 1000 pF | C10 470 pF | R4 47K | R11 100K |
| C3 3 pF | C11 100 pF | R5 50 | R12 15K |
| C4 .01 mF | C12 200 pF | R6A 0 | R13 1 M |
| C5 3 pF | C13 .1 mF | R6B 33K | R14 10K |
| C6 200 pF | C14 .01 mF | R7 47K | R15 10K |
| C7 100 pF | R1A50/RIB | R8 12K | R16 100K |
| C8 470 pF | R2 5400 | R9 100K | R17 220K |
| | | | R18 15K |

A1 and A2 are the first and second one-half stages, respectively, of the National Semiconductor P/N LM 159 integrated circuit chip. A3 and A4 are the first and second one-half stages, respectively, of the National Semiconductor P/N LM 193 or P/M LM 119 integrated circuit chips. The power supply is 5 volts to 15 volts.

Figure 1:
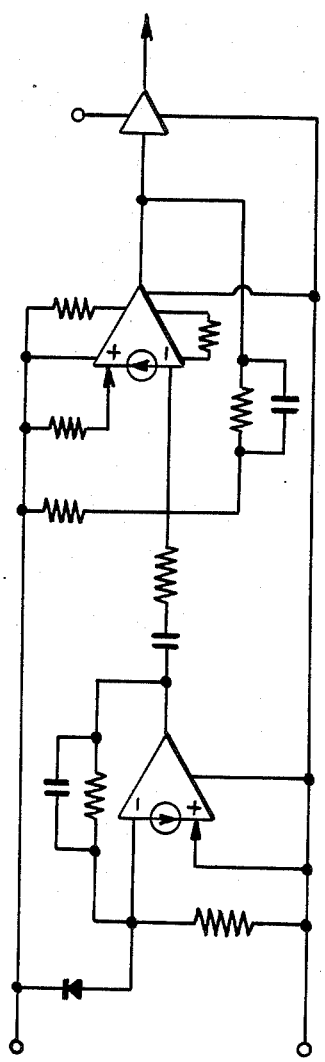
FIG. 1 is a schematic drawing of a typical prior out digital optical receiver circuit.

There are many features in the present invention which clearly show the significant advantage which the present invention achieved over the prior art. Consequently only a few of the more outstanding features will be pointed out to illustrate the unexpected and unusual results obtained by the present invention. One feature is that as illustrated by the circuit shown in FIG. 1, the prior art digital optical receiver circuits overload at levels of input only moderately above the power level at which they are designed to operate. When overloaded such circuits may latch-up and provide no intelligible output. The present invention however, can operate over a wide power input dynamic range without distorting its output signal. Another feature of the present invention is that it can operate in full sunlight with a low false output signal rate due to sun-induced noise. Still another feature of the present invention is its high capacitance drive capability and its capability of permitting multiple units to be wired in parallel without affecting the other features of the system. Still another feature of the present invention is its capability of operating from a single power supply voltage with low power consumption.

It will be understood that the foregoing description is only illustrative of the present invention and it is not intended that the invention be limited thereto. All substitutions, alterations, and modifications of the present invention, which come within the scope of the following claims or to which the present invention is readily susceptible without departing from the spirit and scope of this disclosure are considered part of the present invention.

What is claimed is:

1. In a digital optical receiver: means for receiving pulses of light which may vary in strength over a wide range and providing electrical input pulses having amplitudes corresponding to the strength of the light pulses, means including an amplifier which is driven into saturation by larger ones of the input pulses for producing pulses of predetermined maximum amplitude in response to the input pulses, means for delivering an output pulse in response to the leading edge of the first pulse of predetermined maximum amplitude produced in response to each of the input pulses, and means responsive to the trailing edges of the pulses of predetermined maximum amplitude for preventing the delivering of another output pulse for a predetermined time after each of the trailing edges.

2. The digital optical receiver of claim 1 wherein the means for delivering an output pulse comprises a capacitor, means for changing the charge on the capacitor at a predetermined rate in response to the leading edge of the first pulse of predetermined maximum amplitude, and means responsive to the level of the charge on the capacitor for delivering an output pulse having a duration corresponding to the time required to change the charge between first and second predetermined levels.

3. The digital optical receiver of claim 1 wherein the means for preventing the delivery of an additional output pulse comprises a capacitor, means for changing the charge on the capacitor at a predetermined rate in response to the trailing edges of the pulses of predetermined maximum amplitude, and means for preventing the delivery of an output pulse until the charge on the capacitor reaches a predetermined level.

4. In a digital optical receiver: means for receiving pulses of light which may vary in strength over a wide range and providing electrical input pulses having amplitudes corresponding to the strength of the light pulses, means including an amplifier which is driven into saturation by larger ones of the input pulses for producing a pulse of predetermined maximum amplitude and uncontrolled width in response to each of the input pulses, a capacitor, means for changing the charge on the capacitor at a predetermined rate, means responsive to the leading edge of the pulse of predetermined maximum amplitude for initiating a change in the charge on the capacitor at the predetermined rate, and means responsive to the level of the charge on the capacitor for delivering an output pulse having a width corresponding to the time required to change the charge between first and second predetermined levels at the predetermined rate.

5. In a digital optical receiver: means for receiving pulses of light which may vary in strength over a wide range and providing electrical input pulses having amplitudes corresponding to the strength of the light pulses, a first comparator which switches between first and second output states in response to the input pulses, a second comparator which delivers an output signal when the input of the second comparator is below a predetermined level, a capacitor connected between the output of the first comparator and the input of the second comparator for causing the second comparator to deliver an output signal when the capacitor is in a discharged state and the first comparator switches to its second output state in response to an input pulse, means active when the first comparator is in its second output state for charging the capacitor at a relatively fast rate to a level greater than the predetermined level, and means active when the first comparator is in its first output state for discharging the capacitor at a relatively slow rate to a level below the predetermined level.

6. The digital optical receiver of claim 5 wherein the means for charging the capacitor comprises a charging resistor connected to the junction of the capacitor and the input of the second comparator.

7. The digital optical receiver of claim 6 wherein the means for discharging the capacitor includes a second capacitor connected to the side of the first named capacitor connected to the output of the first comparator, and a second charging resistor connected to the junction of the two capacitors.

8. The digital optical receiver of claim 7 wherein the time constant of the second resistor and the second capacitor is on the order of five times the time constant of the first named resistor and capacitor.

9. In a digital optical receiver: means for receiving pulses of light which may vary in strength over a wide range and providing electrical input pulses having amplitudes corresponding to the strength of the light pulses, means for producing pulses of predetermined maximum amplitude and uncontrolled width in response to the input pulses, a first comparator which changes output states in response to the pulses of predetermined maximum amplitude, a second comparator which delivers an output signal when its input is at a predetermined level, a first capacitor having a first side connected to the output of the first comparator and a second side connected to the input of the second comparator, a first charging resistor connected between a voltage source and the second side of the first capacitor for charging the first capacitor to a level which prevents the input of the second comparator from reaching the predetermined level, a second capacitor connected between the first side of the first capacitor and a common point for charging the first capacitor to a level which permits the input of the second comparator to reach the predetermined level in response to a change in the output state of the first comparator, and a second charging resistor connected between the junction of the two capacitors and the voltage source, the second charging resistor and the second capacitor having a time constant substantially greater than the time constant of the first charging resistor and the first capacitor.

10. The digital optical receiver of claim 9 wherein the second capacitor has a capacitance on the order of five times the capacitance of the first capacitor.

* * * * *